(12) United States Patent
Park et al.

(10) Patent No.: US 6,343,037 B1
(45) Date of Patent: Jan. 29, 2002

(54) COLUMN REDUNDANCY CIRCUIT FOR SEMICONDUCTOR MEMORY

(75) Inventors: San Ha Park, Choongcheongbuk-Do; Ju Han Kim, Kyoungki-Do; Hong Beom Pyeon, Choongcheongbuk-Do, all of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/625,642

(22) Filed: Jul. 25, 2000

(30) Foreign Application Priority Data

Jul. 26, 1999 (KR) ............................................. 99-30393

(51) Int. Cl.$^7$ ................................................. G11C 7/00
(52) U.S. Cl. ................... 365/200; 365/210; 365/230.06
(58) Field of Search ........................... 365/200, 230.08, 365/210, 225.7, 189.11, 190, 236, 233

(56) References Cited

U.S. PATENT DOCUMENTS 6,067,260 A  *  5/2000  Ooishi et al. ............... 365/200
6,144,577 A  *  11/2000  Hidaka ........................ 365/63
6,172,921 B1  *  1/2001  Park et al. .................... 365/200

* cited by examiner

Primary Examiner—David Nelms
Assistant Examiner—Thong Le
(74) Attorney, Agent, or Firm—Morgan, Lewis & Bockius LLP (57) ABSTRACT

The present invention relates to a column redundancy circuit for a semiconductor memory which can facilitate a high integration semiconductor circuit whose memory array is divided into a plurality of array units to be properly operated at a high frequency. The plurality of array units in the memory array include a plurality of normal memory cells and a plurality of redundancy memory cells. The normal data stored in the plurality of normal memory cells and the redundancy data stored in the plurality of redundancy memory cells are outputted through a local normal input/output line and a local redundancy input/output line, respectively. The column redundancy unit outputs a redundancy enable signal according to a column address, a row address, and a state of a fuse. The normal data stored in the plurality of normal memory cells or the redundancy data stored in the plurality of redundancy memory cells is selected according to a logical state of the redundancy enable signal, and outputted to a main amplifier via a global input/output line.

20 Claims, 8 Drawing Sheets

COLUMN REDUNDANCY CIRCUIT FOR SEMICONDUCTOR MEMORY

This application claims the benefit of Korean patent application No. 30393/1999, filed Jul. 26, 1999, which is hereby incorporated by reference.

BACKGROUND OF THE INVENTION

1. Field of the Invention

The present invention relates to a column redundancy circuit for semiconductor memory, and in particular to a column redundancy circuit for a semiconductor memory which can facilitate a high integration semiconductor circuit whose memory array is divided into a plurality of array units to be properly operated at a high frequency, by selecting and outputting one of a normal data or a redundancy data which are outputted from the memory array, according to a row address and a column address.

2. Discussion of the Background Art

Figure 1:
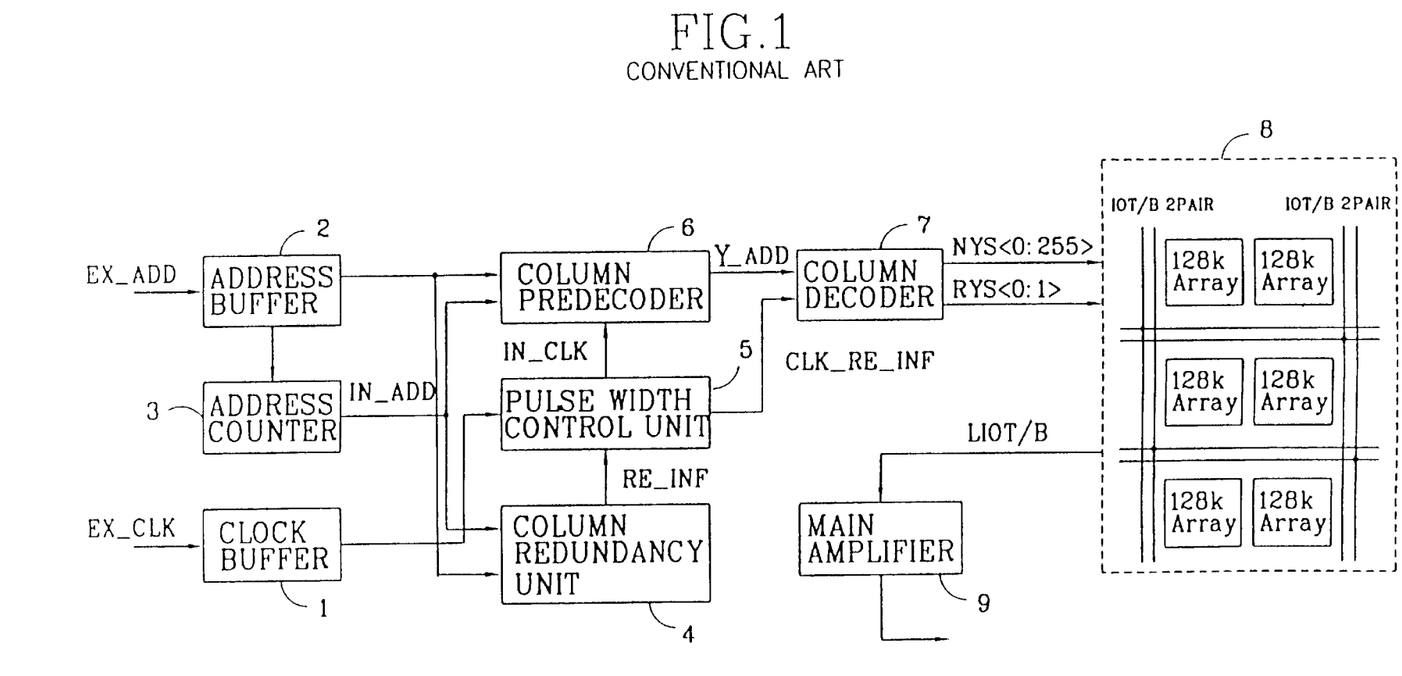
FIG. 1 is a block diagram illustrating a conventional column redundancy circuit employing a column address of a semiconductor memory.

FIG. 1 is a block diagram illustrating the conventional column redundancy circuit using the column address.

A clock buffer 1 buffers an external clock signal EX_CLK and outputs it to a pulse width control unit 5. An address buffer 2 buffers an external address EX_ADD and outputs it to a column redundancy unit 4 and a column predecoder 6. In a burst mode, an address counter 3 counts the buffered external address EX_ADD, and outputs an internal address IN_ADD to the column redundancy unit 4 and the column predecoder 6. The column redundancy unit 4 determines whether to repair each memory array unit according to the external address EX_ADD and the internal address IN_ADD to be inputted to the column redundancy unit 4, and outputs corresponding redundancy information RE_INF. The pulse width control unit 5 serves to output the internal clock signal EX_CLK to the column predecoder 6 for determining a pulse width of a column selecting signal according to the buffered external clock signal EX_CLK, and to output a redundancy clock signal CLK_RE_INF having the redundancy information RE_INF to a column decoder 7.

The column predecoder 6 enables a normal address path in a non-redundancy mode where a repair operation is not performed. To the contrary, the column predecoder 6 disables the normal address path in a redundancy mode where the repair operation is carried out, predecodes a column address Y_ADD from the address buffer 2, and outputs it to the column decoder 7. A pulse width of the predecoded column address Y_ADD is determined by the external clock signal EX_CLK.

The column decoder 7 determines whether to repair according to the redundancy clock signal CLK_RE_INF, and outputs a normal column selecting signal NYS or a redundancy column selecting signal RYS to a memory array 8. That is, the column decoder 7 outputs the normal column selecting signal NYS in the non-redundancy mode, and outputs the redundancy column selecting signal RYS in the redundancy mode. Here, the normal column selecting signal NYS and the redundancy column selecting signal RYS are signals for selecting a sense amplifier (not shown) in the memory array 8.

The memory array 8 consists of a plurality of normal memory cells and a plurality of redundancy memory cells. When the column decoder 7 outputs the normal column selecting signal NYS, the data stored in the normal memory cells of the memory array are read. In case the column decoder 7 outputs the redundancy column selecting signal RYS, the data stored in the redundancy memory cells of the memory array 8 are read. The data which have been read are-inputted to a main amplifier 9 via an input/output line LIOT/B, amplified and outputted to an output buffer (not shown).

Figure 2A:
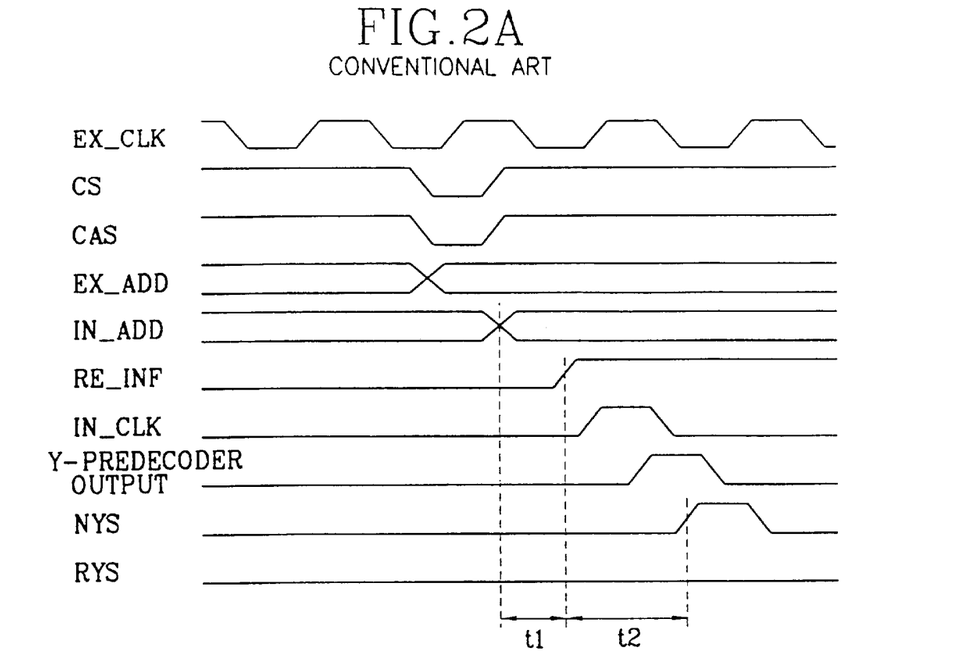
FIGS. 2A and 2B are timing diagrams for the circuit in FIG. 1 in a non-redundancy mode and in a redundancy mode, respectively.
Figure 2B:
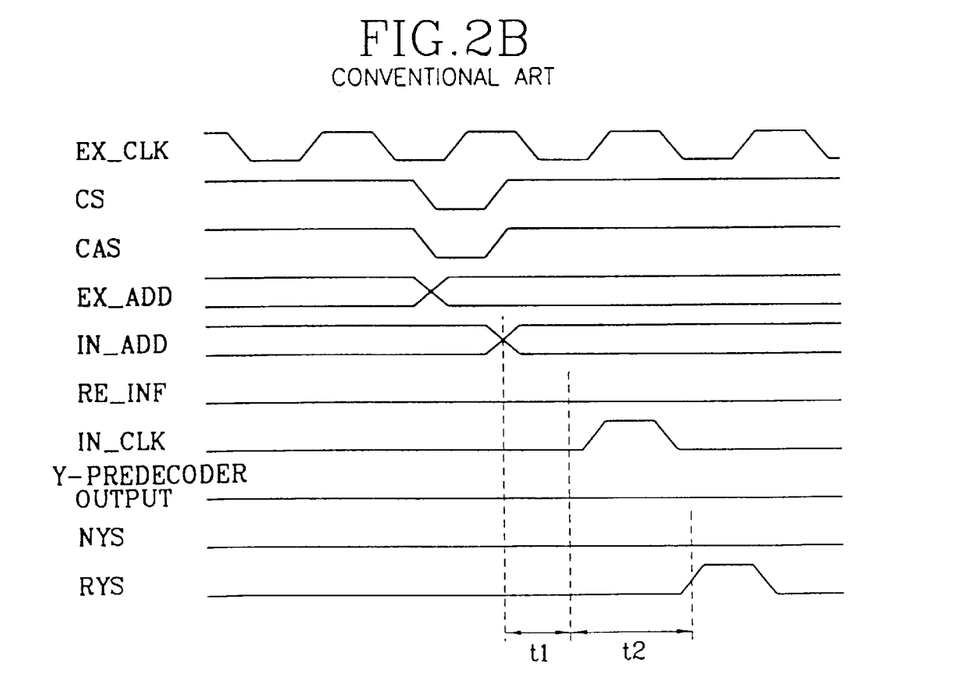

FIGS. 2A and 2B are timing diagrams for the circuit in FIG. 1. FIG. 2A is a timing diagram in the non-redundancy mode, and FIG. 2B is a timing diagram in the redundancy mode. As shown in the Figures, if a column address strobe signal CAS is inputted in a state where the external clock signal EX_CLK is inputted, the external address EX_ADD and the internal address IN_ADD are transited. When a first predetermined time t1 lapses after the internal address IN_ADD is transited, the redundancy information RE_INF is at a high level, and the redundancy clock signal EX_CLK is also at a high level. As shown in FIG. 2A, the redundancy clock signal EX_CLK being at a high level implies that the column redundancy circuit is operated in the non-redundancy mode. In FIG. 2B, the redundancy clock signal EX_CLK being at a high level means that the column redundancy circuit is operated in the redundancy mode.

When a second predetermined time t2 lapses after the first predetermined time t1, the normal column selecting signal NYS is enabled in the normal mode, as shown in FIG. 2A, and the redundancy column selecting signal RYS is enabled in the redundancy mode, as depicted in FIG. 2B.

The second predetermined time t2 is a time taken to determine whether the column predecoder 6 and the column decoder 7 operate the column redundancy circuit in the normal mode or the redundancy mode according to whether to repair, and is identical in the normal mode and the redundancy mode.

The second predetermined time t2 is clearly longer when the normal column selecting signal NYS is outputted without determining whether to repair. As the second predetermined time t2 becomes longer, a total processing speed of the column redundancy circuit is reduced.

Figure 3:
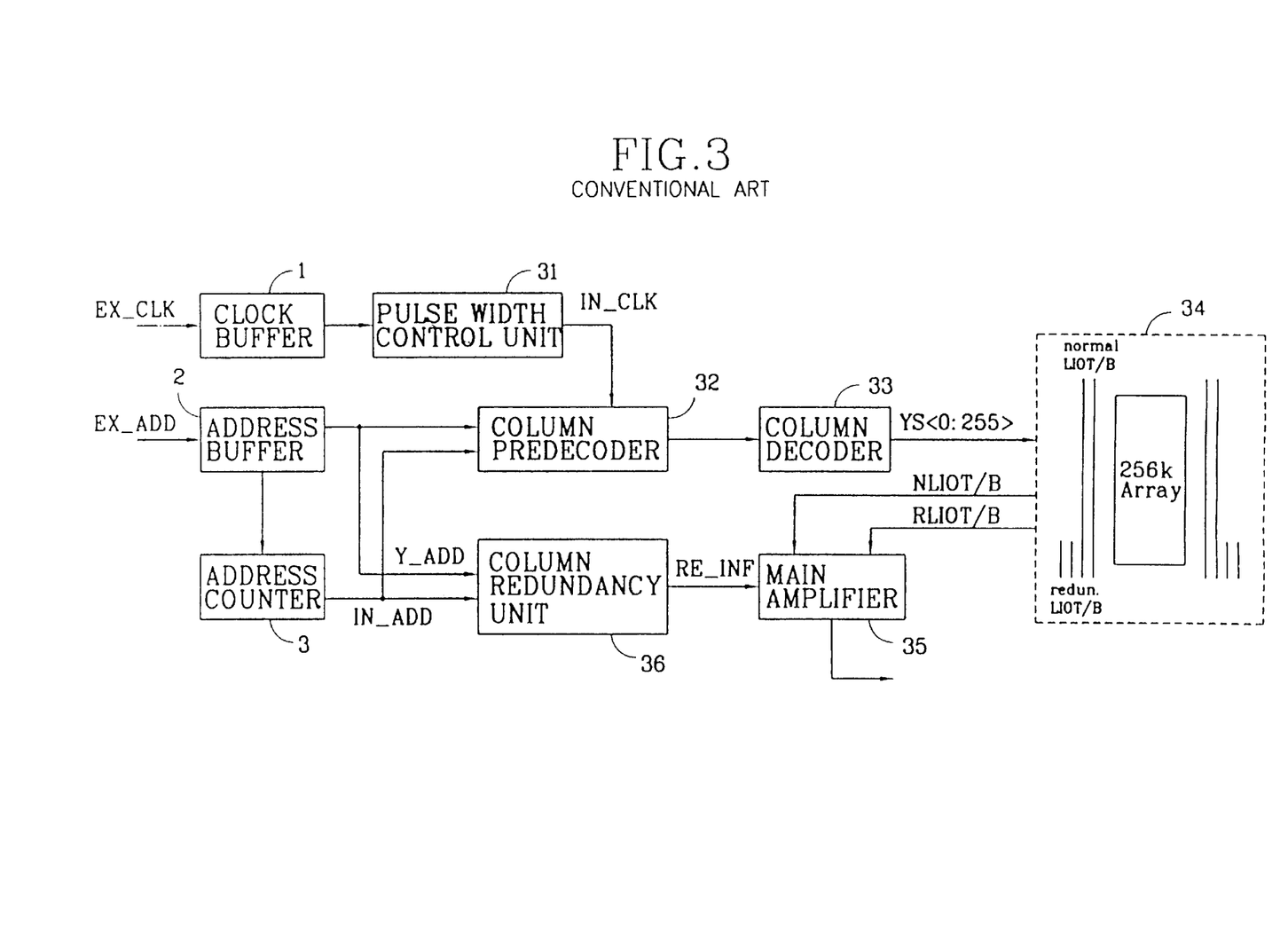
FIG. 3 is a block diagram illustrating a conventional redundancy circuit of the semiconductor memory.

In order to overcome such a disadvantage, FIG. 3 illustrates a block diagram of another conventional redundancy circuit. As shown in Figures, the clock buffer 1, the address buffer 2 and the address counter 3 are identical in constitution and operation to those in FIG. 1. A pulse width control unit 31 outputs an internal clock signal IN_CLK to a column predecoder 32 for determining a pulse width of a column selecting signal according to a buffered external clock signal EX_CLK. A column address Y_ADD is inputted to a column decoder 33 via the address buffer 2 and the column predecoder 32. The column decoder 33 outputs a column selecting signal YS to the memory array 34. Here, the column address Y_ADD and the column selecting signal YS are not related to a repair operation. The memory array 34 includes normal memory cells and redundancy memory cells. Each array is not divided into a plurality of array units, differently from the memory array 8 as illustrated in FIG. 1. The data stored in the normal array cells are inputted to a main amplifier 35 through a normal input/output line NLIOT/B, and the data stored in the redundancy memory cells are inputted to the main amplifier 35 via a redundancy input/output line RLIOT/B.

The column redundancy unit 36 determines whether to repair the normal input/output line NLIOT/B and the redundancy input/output line RLIOT/B, and outputs redundancy information RE_INF to the main amplifier 35. According to the redundancy information RE_INF, the main amplifier 35 amplifies and outputs one of the data inputted through the normal input/output line NLIOT/B or the redundancy input/output line RLIOT/B.

As described above, in the circuit as shown in FIG. 3, when the column selecting signal YS (identical to the normal column selecting signal NYS as shown in FIG. 1) is outputted to the memory array 34, whether to repair or not is determined, differently from the circuit as shown in FIG. 1. Accordingly, an extra amount of time to determine whether to repair is not necessary. As a result, the circuit in FIG. 3 is faster in operation than the circuit in FIG. 1. However, the memory array is not divided, and thus redundancy efficiency is reduced. In addition, as the memory array is divided into a plurality of array units, and thus the number of the array units is increased, a load of the redundancy input/output line RLIOT/B is also increased. Accordingly, in order to employ such a circuit, the number of the array units must be limited. Thus, it is not suitable for a high integration circuit where the memory array is divided into many array units.

SUMMARY OF THE INVENTION

Accordingly, a primary object of the present invention to provide a column redundancy circuit for a semiconductor memory which can improve an operational speed of a high integration semiconductor circuit whose memory array is divided into a plurality of memory array units.

It is another object of the present invention to provide a column redundancy circuit for a semiconductor memory wherein a memory array uses an identical global input/output line both in a normal mode and a redundancy mode, thereby reducing a layout of the memory array.

In order to achieve the above-described objects of the present invention, there is provided a column redundancy circuit for a semiconductor memory comprising a column decoder for receiving a predecoded column address and an internal clock signal and for outputting a normal column selecting signal and a redundancy column selecting signal, a column redundancy unit for outputting a redundancy enable signal in accordance with a column address, a row address, and a state of fuse, and a memory array including a plurality of array units having a plurality of normal memory cells and a plurality of redundancy memory cells, and a switch unit selecting and outputting one of a normal data stored in the normal memory cell according to the normal column selecting signal or a redundancy data stored in the redundancy memory cell according to the redundancy column selecting signal, wherein the data selected by the switch unit is outputted to a main amplifier via a global input/output line in accordance with the redundancy enable signal.

In order to achieve the above-described objects of the present invention, there is provided a column redundancy circuit for a semiconductor memory including a column redundancy unit outputting a redundancy enable signal in accordance with a column address, a row address, and a state of fuse, a memory array consisting of a plurality of array units, respectively having a plurality of normal memory cells and a plurality of redundancy memory cells, and a switch unit selecting and outputting one of a normal data stored in the normal memory cell or a redundancy data stored in the redundancy memory cell in accordance with the redundancy enable signal, wherein the data selected and outputted by the switch unit is outputted to a main amplifier via a global input/output line.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A column redundancy circuit for a semiconductor memory in accordance with the present invention will now be described with reference to the accompanying drawings.

Figure 4:
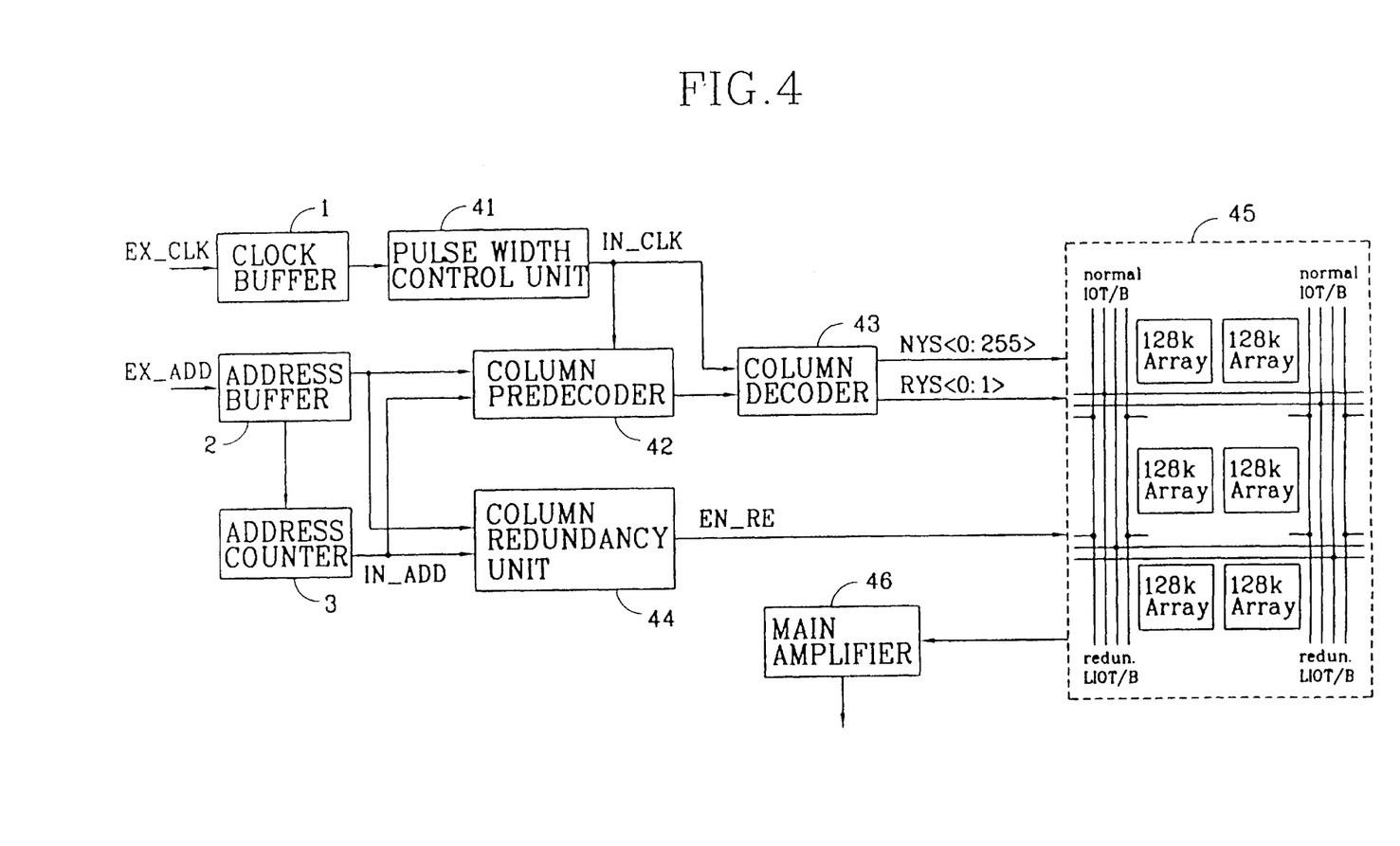
FIG. 4 is a block diagram illustrating a column redundancy circuit employing a column address of a semiconductor memory in accordance with a preferred embodiment of the present invention.

FIG. 4 is a block diagram illustrating the column redundancy circuit using a column address of the semiconductor memory in accordance with a preferred embodiment of the present invention. A clock buffer 1, an address buffer 2, and an address counter 3 as shown in FIG. 4 are identical in constitution and operation to those as shown in FIG. 1, and thus explanation thereof is omitted.

A pulse width control unit 41 outputs an internal clock signal IN_CLK to a column predecoder 42 and a column decoder 43 according to an external clock signal EX_CLK buffered in the clock buffer 1 for controlling a pulse width of a column selecting signal. A column decoder 43 receives a predecoded column address and the internal clock signal IN_CLK, and outputs a normal column selecting signal NYS and a redundancy column selecting signal RYS to a memory array 45, regardless of whether to repair.

A column redundancy unit 44 receives an external address EX_ADD from the address buffer 2 and an internal address IN_ADD from the address counter 3, determines whether to repair, and outputs a redundancy enable signal EN_RE to the memory array 45. In more detail, referring to FIG. 5, the column redundancy unit 44 consists of a plurality of enable units 440–447 outputting a column address true signal Y_ADDnT or a column address bar signal Y_ADDnB in accordance with row addresses X_ADD0 and X_ADD1 and state of fuses F0 and F1; and a combination unit 448 combining the signals outputted from the plurality of enable units 440–447 and outputting a redundancy enable signal EN_RE to the memory array 45.

Figure 5:
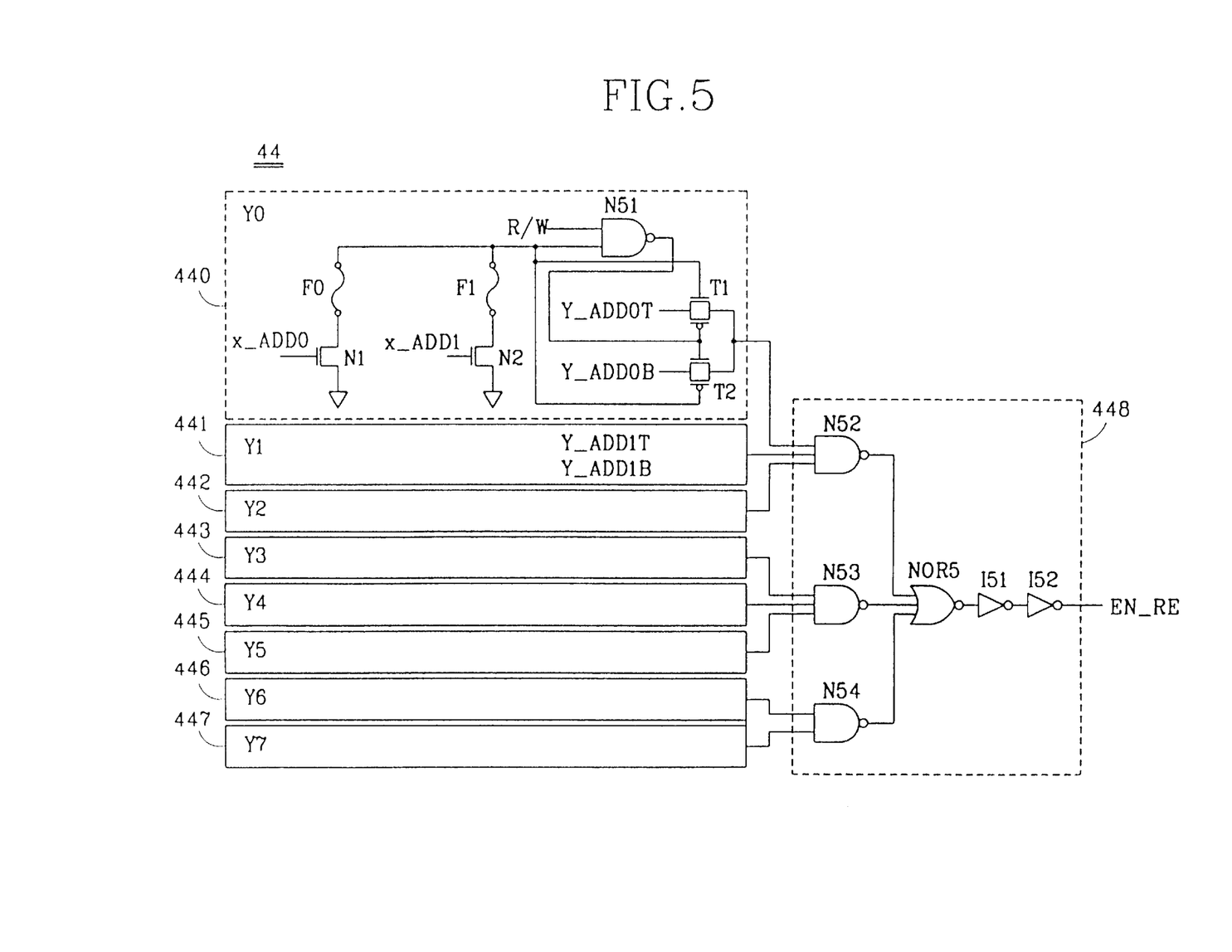
FIG. 5 is a detailed structure view illustrating a column redundancy unit in the configuration of FIG. 4.

The number of the plurality of enable units 440–447 is identical to that of the column addresses. A first enable unit 440 includes: a NAND gate N51 receiving a read/write enable signal R/W at its one-side input terminal; a plurality of fuses F0 and F1; a plurality of switching transistors N1 and N2 having their gates connected to receive the row addresses X_ADD0 and X_ADD1 and being connected to the other input terminal of the NAND gate N51 through the fuses F0 and F1; and two transmission gates T1 and T2. In FIG. 5, only two fuses F0 and F1 and two switching transistors N1 and N2 are illustrated for convenience. However, the entire number thereof is identical to the number of the row addresses.

The two transmission gates T1 and T2 are turned on/off according to a level of an output signal from the NAND gate N51 and a level of the other side input terminal of the NAND gate N51. A first column address true signal Y_ADD0T is passed through the first transmission gate T1 and a first column address bar signal Y_ADD0B is passed through the second transmission gate T2. The first transmission gate T1 and the second transmission gate T2 have a complementary relationship. That is, when the first column address true signal Y_ADD0T is passed, the first column address bar signal Y_ADD0B is interrupted. Also, when the first column address bar signal Y_ADD0B is passed, the first column address true signal Y_ADD0T is interrupted. The other enable units 441–447 are identical in constitution to the first enable unit 440. However, each enable unit 441–447 outputs different address signals. For instance, the second enable unit 441 selectively outputs a second column address true signal Y_ADD1T or a second column address bar signal Y_ADD1B.

When the column address true signals Y_ADD0T through Y_ADD7T or the column address bar signals Y_ADD0B through Y_ADD7B outputted from the plurality of enable units 440–447 are all at a high level, the combination unit 448 outputs the redundancy enable signal EN_RE having a high level to the memory array 45. The combination unit 448 includes: NAND gates N52, N53, and N54 NANDing a predetermined number of output signals among the output signals from the enable units 440–447, respectively; a NOR gate NOR5 NORing output signals from the NAND, gates N52, N53, and N54; and two inverters I51 and I52 buffering a level of the output signal from the NOR gate NOR5 and outputting the redundancy enable signal EN_RE.

The operation of the first enable unit 440 will now be explained. It is presumed that the read/write enable signal R/W is enabled, that is the input terminal at the one side of the first NAND gate N51 is at a high level.

The plurality of row addresses X_ADD0 and X_ADD1 which are inputted from the address buffer 2 are sequentially coded. After a first row address X_ADD0 is coded, a second row address X_ADD1 is coded. When the first row address X_ADD0 is coded, the first switching transistor N1 is turned on. In this state, if the first fuse F0 is disconnected, the terminal at the other side of the first NAND gate N51 is at a high level. To the contrary, if the first fuse F0 is connected, the terminal at the other side of the first NAND gate N51 is at a low level.

In the case, when the first fuse F0 is disconnected, namely when it is presumed that the terminal at the other side of the NAND gate N51 is at a high level, the NAND gate N51 outputs a low-level signal. As a result, the first transmission gate T1 is turned on and thus the column address true signal Y_ADD0T is passed through. To the contrary, when the first fuse F0 is not disconnected, namely when the terminal at the other side of the NAND gate NAND51 is at a low level, the first transmission gate T1 is turned off and the second transmission gate T2 is turned on. Thus the column address bar signal Y_ADD0B is passed through.

As described above, the first enable unit 440 outputs the first column address true signal Y_ADD0T or the first column address bar signal Y_ADD0B according to whether the fuse is connected or disconnected. In addition, the second enable unit 441 outputs the second column address true signal Y_ADD1T or the second column address bar signal Y_ADD1B according to whether a fuse (not shown) is connected or disconnected.

Each of the eight enable units 440–447 selectively outputs one of first to eighth column address true signals, Y_ADD0T through Y_ADD7T, or one of first to eighth column address bar signals, Y_ADD0B through Y_ADD7B, respectively, according to the row address signals X_ADD0 and X_ADD1. The signals outputted from the first to third enable units 440–442 are NANDed in the second NAND gate N52, the signals outputted from the fourth to sixth enable units 443–445 are NANDed in the third NAND gate N53, and the signals outputted from the seventh and eight enable units 446 and 447 are NANDed in the fourth NAND gate N54. According to the present invention, the address signals respectively outputted from the eight enable units 440–447 are NANDed in the three NAND gates N52–N54. However, the number of the NAND gates may be changed, if necessary.

The signals outputted from the second to fourth NAND gates N52–N54 are combined in the NOR gate NOR5, and the levels thereof are converted in the two inverters I51 and I52. Accordingly, the signals are outputted to the memory array 45 as the redundancy enable signal EN_RE. As described above, the combination unit 448 outputs the redundancy enable signal EN_RE at a high level when the eight address signals are all at a high level and outputs the redundancy enable signal EN_RE at a low level when any of the eight address signals is at a low level.

Figure 6:
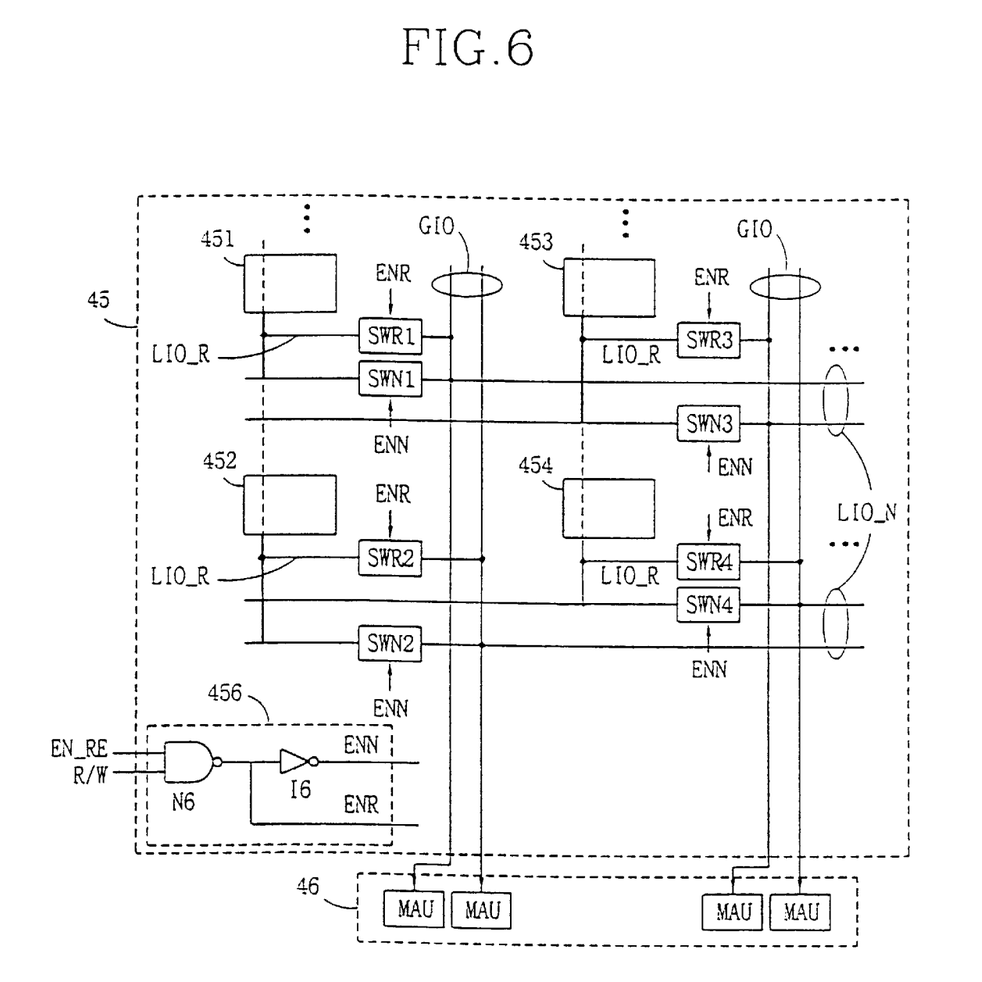
FIG. 6 is a detailed circuit view illustrating a memory array in the configuration of FIG. 4.

The memory array 45 outputs a normal data or a redundancy data to a main amplifier 46 according to the redundancy enable signal EN_RE. FIG. 6 is a detailed structure view illustrating the memory array in accordance with the preferred embodiment of the present invention. As shown in Figures, the memory array 45 includes: a plurality of array units 451–454 consisting of a plurality of normal memory cells and a plurality of redundancy memory cells; a local normal input/output line LIO_N connected to each array unit 451–454, and transmitting the normal data stored in the normal memory cell; a local redundancy input/output line LIO_R connected to each array unit 451–454, and transmitting the redundancy data stored in the redundancy memory cell; and a global input/output line GIO commonly connected to the local normal input/output line LIO_N and the local redundancy input/output line LIO_R.

In addition, the memory array 45 further includes a switch unit which receives the redundancy enable signal EN_RE from the combination unit 448 and transmits/interrupts the redundancy data or the normal data to/from the global input/output line GIO. The switch unit includes: a buffer unit 456 buffering the redundancy enable signal EN_RE and outputting a redundancy switching signal ENR and a normal switching signal ENN; a plurality of redundancy'switches SWR1–SWR4 switched according to the redundancy switching signal ENR and connecting the local redundancy input/output line LIO_R to the global input/output line GIO; and a plurality of normal switches SWN1–SWN4 switched according to the normal switching signal ENN, and connecting the local normal input/output line LIO_N to the global input/output line GIO.

The buffer unit 456 buffers the redundancy enable signal EN_RE, thereby outputting the redundancy switching signal ENR and the normal switching signal ENN having an opposite logic state to the redundancy switching signal ENR. For this, the buffer unit 456 includes: a NAND gate N6 NANDing the read/write enable signal R/W and the redundancy enable signal EN_RE and outputting the redundancy switching signal ENR; and an inverter I6 inverting the redundancy switching signal ENR and outputting the normal switching signal ENN.

When the read/write enable signal R/W is at a high level and the high-level redundancy enable signal EN_RE is inputted, the NAND gate N6 outputs an output signal at a low level. The output signal is supplied to the plurality of redundancy switches SWR1–SWR4 as the redundancy switching signal ENR. The inverter I6 inverting the output from the NAND gate N6 outputs the normal switching signal ENN at a high level, and the normal switching signal ENN is applied to the plurality of normal switches. As the normal switching signal ENN becomes at a high level, the normal switches SWN1–SWN4 are electrically connected. Accordingly, the normal data stored in the normal memory cell are applied to the global line GIO via each local normal input/output line LIO_N, and transmitted to the sense amplifier 46. Here, the redundancy switches SWR1–SWR4 are not enabled because of the low-level redundancy switching signal ENR. To the contrary, when the redundancy enable signal EN_RE is at a low level, the redundancy switching signal ENR becomes a high level, and thus the plurality of redundancy switches SWR1–SWR4 are enabled. Accordingly, the normal switching signal ENN becomes a low level, and thus the plurality of normal switches SWN1–SWN4 are disabled. As a result, the redundancy data stored in the redundancy memory cell are applied to the global line GIO through each local redundancy input/output line LIO_R, and transmitted to the sense amplifier 46.

Figure 7A:
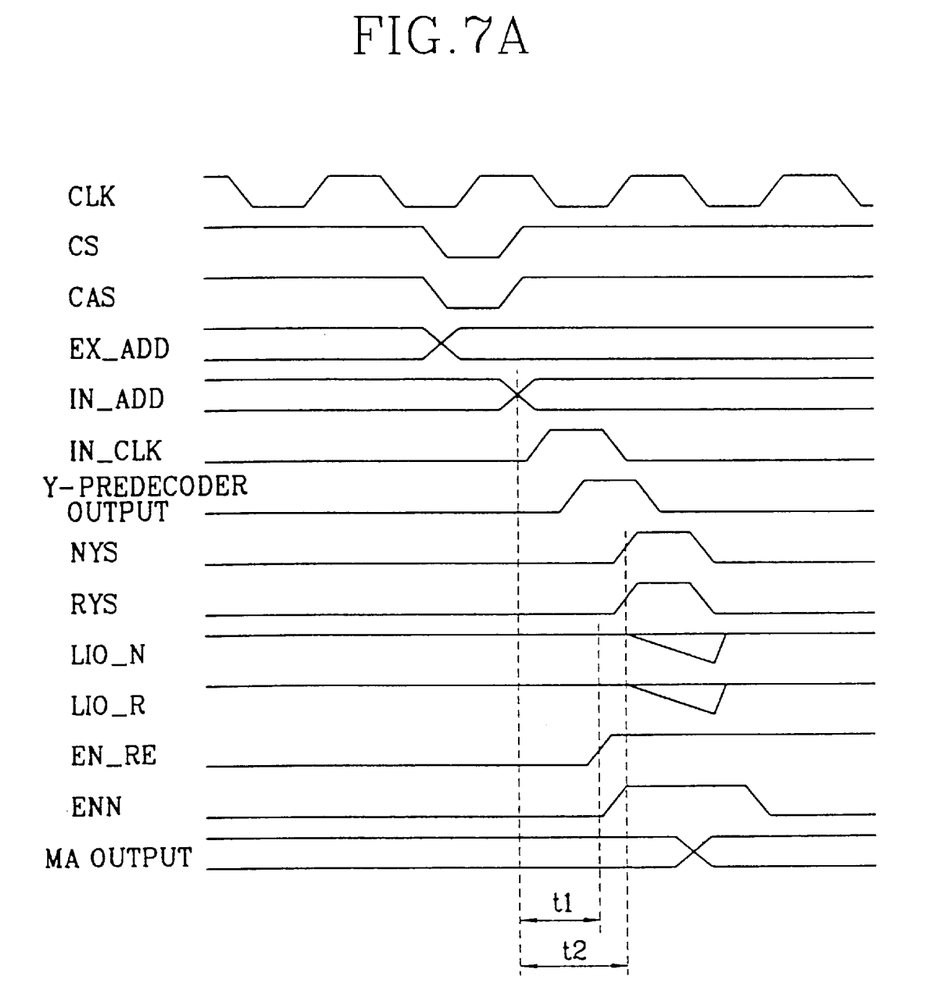
FIGS. 7A and 7B are timing diagrams for the circuit in FIG. 4 in a non-redundancy mode and in a redundancy mode, respectively.
Figure 7B:
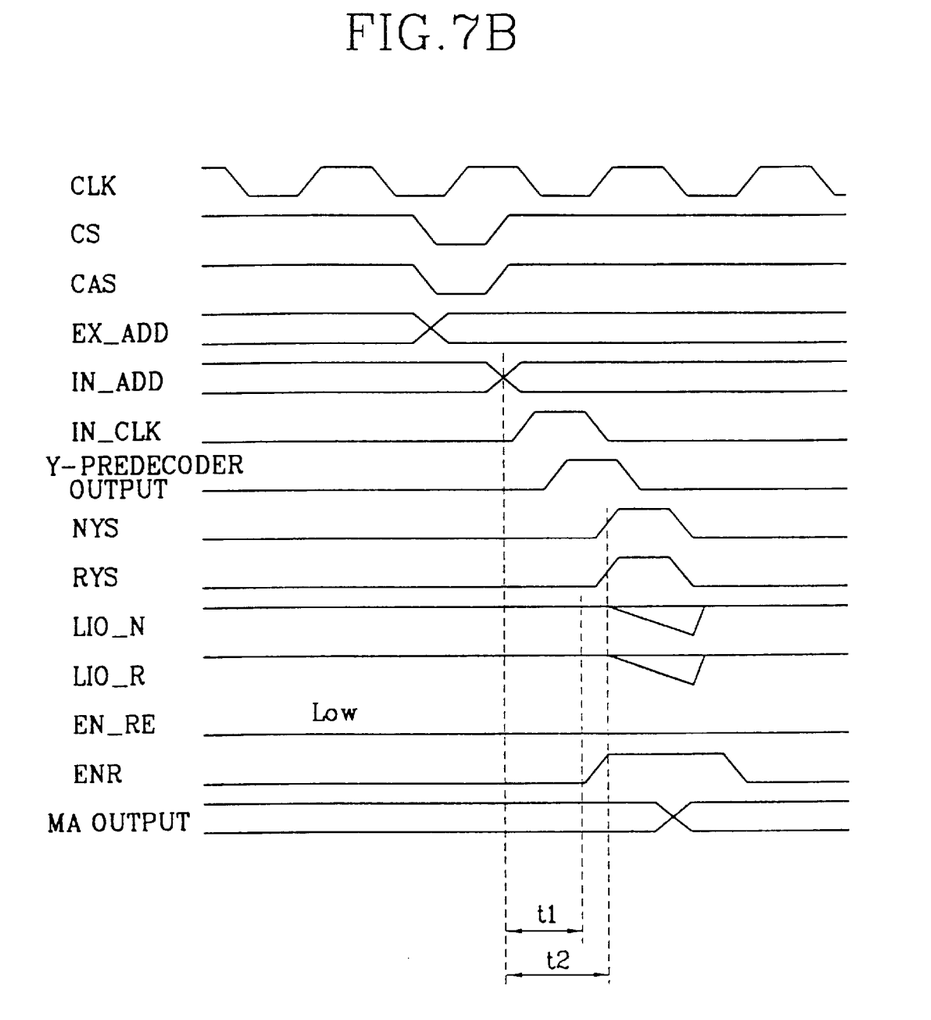

FIGS. 7A and 7B are timing diagrams for the circuit in FIG. 4. FIG. 7A is a timing diagram in a non-redundancy mode and FIG. 7B is a timing diagram in a redundancy mode. Referring to FIGS. 7A and 7B, the points that the external address EX_ADD and the internal address IN_ADD are transited are identical as shown in FIGS. 2A and 2B. However, referring to FIGS. 2A and 2B, the redundancy clock signal EX_CLK becomes a high level when a first predetermined time t1 lapses after the internal address IN_ADD is transited. According to the preferred embodiment of the present invention, as depicted in FIGS. 7A and 7B, the redundancy clock signal EX_CLK becomes a high level as soon as the internal address IN_ADD is transited. In the conventional art, the normal column selecting signal NYS and the redundancy column selecting signal RYS are outputted when the first predetermined time t1 and the second predetermined time t2 lapse after the internal address IN_ADD is transited. However, in accordance with the preferred embodiment of the present invention, the normal column selecting signal NYS and the redundancy column selecting signal RYS are outputted when the second predetermined time t2 lapses after the internal address IN_ADD is transited. Accordingly, the present invention reduces the operating time of the column redundancy circuit of the conventional art by the amount of the time from an internal address transition point to an output point of the redundancy clock signal having the redundancy information (the first predetermined time t1).

As discussed earlier, the column redundancy circuit in accordance with the present invention can improve speed by switching the data outputted from the memory array according to the redundancy information. In addition, in the normal mode, the normal data outputted from the memory array is amplified in the main amplifier, and in the redundancy mode, the redundancy data outputted from the memory array is amplified in the main amplifier. As a result, the present invention can be applied even when a load of the input/output line is high. In addition, since the redundancy data or the normal data is selectively outputted to the sense amplifier via the global input/output line, only one global input/output line is used for outputting the redundancy data and the normal data, thereby reducing the layout of the memory array. The aforementioned effects and benefits are increased in accordance with high integration of a semiconductor memory circuit.

It will be apparent to those skilled in the art that various modifications and variations can be made in the column redundancy circuit for semiconductor memory of the present invention without departing from the spirit or scope of the invention. Thus, it is intended that the present invention cover the modifications and variations of this invention provided they come within the scope of the appended claims and their equivalents.

What is claimed is:

1. A column redundancy circuit for a semiconductor memory, comprising:

a column decoder for receiving a predecoded column address and an internal clock signal, and for outputting a normal column selecting signal and a redundancy column selecting signal;

a column redundancy unit for outputting a redundancy enable signal in accordance with a column address, a row address, and a state of fuse; and a memory array including a plurality of array units having a plurality of normal memory cells and a plurality of redundancy memory cells, and a switch unit selecting and outputting one of a normal data stored in the normal memory cell according to the normal column selecting signal or a redundancy data stored in the redundancy memory cell according to the redundancy column selecting signal, wherein the data selected by the switch unit is outputted to a main amplifier via a global input/output line in accordance with the redundancy enable signal.

2. The column redundancy circuit according to claim 1, further comprising a pulse width control unit for outputting the internal clock signal to the column decoder in order to control a pulse width of a column selecting signal according to a buffered external clock signal.

3. The column redundancy circuit according to claim 1, wherein the memory array comprises:

a local normal input/output line connected to the array units and transmitting the normal data; and a local redundancy input/output line connected to the array units and transmitting the redundancy data, and wherein the switch unit comprises:

a buffer unit for buffering the redundancy enable signal and outputting a redundancy switching signal or a normal switching signal;

a plurality of redundancy switches being switched according to the redundancy switching signal and connecting the local redundancy input/output line to the global input/output line; and a plurality of normal switches being switched according to the normal switching signal and connecting the local normal input/output line to the global input/output line.

4. The column redundancy circuit according to claim 3, wherein the buffer unit comprises:

a NAND gate for NANDing the redundancy enable signal and a read/write enable signal and outputting the redundancy switching signal; and an inverter for inverting an output from the NAND gate and outputting the normal switching signal.

5. The column redundancy circuit according to claim 1, wherein the column redundancy unit comprises:
a plurality of enable units for outputting a column address true signal or a column address bar signal, respectively, according to the row address and the state of fuse, and
a combination unit for combining signals outputted from the plurality of enable units and outputting the redundancy enable signal.

6. The column redundancy circuit according to claim 5, wherein a number of the plurality of enable units is identical to a number of the column addresses.

7. The column redundancy circuit according to claim 5, wherein each of the plurality of enable units comprises:
a switching transistor being switched according to the row address;
a first transmission gate for outputting the column address true signal according to an ON/OFF state of the switching transistor; and
a second transmission gate for outputting the column address bar signal according to the ON/OFF state of the switching transistor,
wherein the first and second transmission gates have a complementary relationship.

8. The column redundancy circuit according to claim 5, wherein each of the plurality of enable units comprises:
a switching transistor being switched according to the row address;
a NAND gate having one side input terminal connected to a read/write enable signal and having the other side input terminal connected to the switching transistor via the fuse;
a first transmission gate being switched according to a logical level of the other side input terminal and output terminal of the NAND gate, and outputting the column address true signal; and
a second transmission gate being switched according to a logical level of the other side input terminal and the output terminal of the NAND gate, and outputting the column address bar signal,
wherein the first and second transmission gates have a complementary relationship.

9. The column redundancy circuit according to claim 5, wherein the combination unit outputs the redundancy enable signal at a high level when the signals outputted from the plurality of enable units are at a high level.

10. The column redundancy circuit according to claim 5, wherein the combination unit comprises:
a plurality of NAND gates for NANDing signals outputted from the plurality of enable units;
a NOR gate for NORing outputs from the plurality of NAND gates; and
two inverters for buffering an output from the NOR gate and outputting the redundancy enable signal.

11. A column redundancy circuit for a semiconductor memory, comprising:
a column redundancy unit for outputting a redundancy enable signal in accordance with a column address, a row address, and a state of a fuse; and
a memory array including a plurality of array units having a plurality of normal memory cells and a plurality of redundancy memory cells, and a switch unit selecting and outputting one of a normal data stored in the normal memory cell or a redundancy data stored in the redundancy memory cell, in accordance with the redundancy enable signal,
wherein the data selected by the switch unit is outputted to a main amplifier via a global input/output line.

12. The column redundancy circuit according to claim 11, further comprising:
a pulse width control unit for outputting an internal clock signal in order to control a pulse width of a column selecting signal according to a buffered external clock signal; and
a column decoder for receiving a predecoded column address and the internal clock signal, and for outputting a normal column selecting signal and a redundancy column selecting signal,
wherein the normal data is outputted according to the normal column selecting signal and the redundancy data is outputted according to the redundancy column selecting signal.

13. The column redundancy circuit according to claim 11, wherein the memory array comprises:
a local normal input/output line connected to the array units and transmitting the normal data; and
a local redundancy input/output line connected to the array units and transmitting the redundancy data, and
wherein the switch unit comprises:
a buffer unit for buffering the redundancy enable signal and outputting a redundancy switching signal or a normal switching signal;
a plurality of redundancy switches being switched according to the redundancy switching signal and connecting the local redundancy input/output line to the global input/output line; and
a plurality of normal switches being switched according to the normal switching signal and connecting the local normal input/output line to the global input/output line.

14. The column redundancy circuit according to claim 13, wherein the buffer unit comprises:
a NAND gate for NANDing the redundancy enable signal and a read/write enable signal and outputting the redundancy switching signal; and
an inverter for inverting output from the NAND gate and outputting the normal switching signal.

15. The column redundancy circuit according to claim 11, wherein the column redundancy unit comprises:
a plurality of enable units for outputting a column address true signal or a column address bar signal, respectively, according to the row address and the state of fuse; and
a combination unit for combining signals outputted from the plurality of enable units and outputting the redundancy enable signal.

16. The column redundancy circuit according to claim 15, wherein a number of the plurality of enable units is identical to a number of the column addresses.

17. The column redundancy circuit according to claim 15, wherein each of the plurality of enable units comprises:
a switching transistor being switched according to the row address;
a first transmission gate for outputting the column address true signal according to an ON/OFF state of the switching transistor; and
a second transmission gate for outputting the column address bar signal according to the ON/OFF state of the switching transistor, wherein the first and second transmission gates have a complementary relationship.

18. The column redundancy circuit according to claim 15, wherein each of the plurality of enable units comprises:

a switching transistor being switched according to the row address;

a NAND gate having one side input terminal connected to a read/write enable signal and the other side input terminal connected to the switching transistor via the fuse;

a first transmission gate being switched according to a logical level of the other side input terminal and output terminal of the NAND gate and outputting the column address true signal; and a second transmission gate being switched according to the logical level of the other side input terminal and the output terminal of the NAND gate and outputting the column address bar signal, wherein the first and second transmission gates have a complementary relationship.

19. The column redundancy circuit according to claim 15, wherein the combination unit outputs the redundancy enable signal at a high level when the signals outputted from the plurality of enable units are at a high level.

20. The column redundancy circuit according to claim 15, wherein the combination unit comprises:

a plurality of NAND gates for NANDing signals outputted from the plurality of enable units;

a NOR gate for NORing output from the plurality of NAND gates; and two inverters for buffering an output from the NOR gate and outputting the redundancy enable signal.

* * * * *